(12) United States Patent
Srivastava et al.

(10) Patent No.: US 7,088,038 B2
(45) Date of Patent: Aug. 8, 2006

(54) GREEN PHOSPHOR FOR GENERAL ILLUMINATION APPLICATIONS

(75) Inventors: Alok Mani Srivastava, Niskayuna, NY (US); Anant Achyut Setlur, Niskayuna, NY (US); Holly Ann Comanzo, Niskayuna, NY (US)

(73) Assignee: GELcore LLC, Valley View, OH (US)

( * ) Notice: Subject to any disclaimer, the term of this patent is extended or adjusted under 35 U.S.C. 154(b) by 295 days.

(21) Appl. No.: 10/612,117

(22) Filed: Jul. 2, 2003

(65) Prior Publication Data

US 2005/0001532 A1 Jan. 6, 2005

(51) Int. Cl.
*H01J 1/62* (2006.01)

(52) U.S. Cl. .................. 313/501; 257/98; 252/301.4 R; 313/502

(58) Field of Classification Search .................. 313/512, 313/498.4, 99, 510, 503, 112, 501, 502; 257/98, 257/100; 252/301.4 R
See application file for complete search history.

(56) References Cited

U.S. PATENT DOCUMENTS

| | | |
|---|---|---|
| 3,450,642 A | 6/1969 | Hoffman |
| 3,569,764 A | 3/1971 | Hanada et al. |
| 3,617,357 A | 11/1971 | Nagy |
| 4,075,532 A | 2/1978 | Piper et al. |
| 4,079,287 A | 3/1978 | Soules et al. |
| 4,267,485 A | 5/1981 | Murakami et al. |
| 4,705,989 A | 11/1987 | Iwama et al. |
| 4,806,824 A | 2/1989 | Paynter et al. |
| 4,874,984 A | 10/1989 | Sigai et al. |
| 4,891,550 A | 1/1990 | Northrop et al. |
| 4,924,141 A | 5/1990 | Taubner et al. |
| 5,041,758 A | 8/1991 | Huiskes et al. |
| 5,049,779 A | 9/1991 | Itsuki et al. |

(Continued)

FOREIGN PATENT DOCUMENTS

| | | |
|---|---|---|
| EP | 0 993 022 A1 | 4/2000 |
| EP | 1 116 418 B1 | 7/2000 |
| EP | 1 095 998 A2 | 10/2000 |
| EP | 1 138 747 A2 | 10/2001 |
| EP | 1 139 440 A2 | 10/2001 |
| EP | 1 184 893 A2 | 3/2002 |
| EP | 1 193 306 A | 4/2002 |
| WO | WO 00/33389 | 8/2000 |
| WO | WO 01/89000 A1 | 2/2001 |
| WO | WO 01/89001 A2 | 2/2001 |
| WO | WO 01/93342 A1 | 12/2001 |
| WO | WO 02/099902 A1 | 12/2002 |
| WO | WO 03/102113 A1 | 12/2003 |

OTHER PUBLICATIONS

G. Blasse and A. Bril, "On the $E^{3+}$Fluorscene in Mixed Metal Oxides. III. Energy Transfer in $Eu^{3+}$–Activated Tungstates and Molybdates of the Type $Ln_2WO_6$ and $Ln_2MoO_6$", *The Journal of Chemical Physics*, vol. 45, No. 7, Oct. 1966, pp. 2350–2355.

(Continued)

*Primary Examiner*—Vip Patel
*Assistant Examiner*—Glenn D. Zimmerman
(74) *Attorney, Agent, or Firm*—Fay, Sharpe, Fagan, Minnich & McKee, LLP

(57) ABSTRACT

A phosphor having the formula $Na_2(Ln_{1-y-z}Ce_yTb_z)_2B_2O_7$, wherein Ln is selected from the group consisting of La, Y, Gd, Lu, Sc and combinations thereof and wherein y=0.01–0.3 and z=0.0–0.3. The phosphor is suitable for use in a white-light emitting device including a UV/blue semiconductor light source having a peak emission from about 250 to about 550 nm and a phosphor blend including a blue emitting phosphor, a red emitting phosphor and a green emitting phosphor having the above described formula.

24 Claims, 4 Drawing Sheets

U.S. PATENT DOCUMENTS

| | | |
|---|---|---|
| 5,108,959 A * | 4/1992 | Buchanan et al. ............ 501/50 |
| 5,207,948 A | 5/1993 | Wolfe et al. |
| 5,350,971 A | 9/1994 | Jeong |
| 5,612,590 A | 3/1997 | Trushell et al. |
| 5,714,836 A | 2/1998 | Hunt et al. |
| 5,731,658 A | 3/1998 | Lengyel et al. |
| 5,731,659 A | 3/1998 | Soules et al. |
| 5,770,917 A | 6/1998 | Yano et al. |
| 5,838,101 A | 11/1998 | Pappalardo |
| 5,851,063 A | 12/1998 | Doughty et al. |
| 5,859,496 A | 1/1999 | Murazaki et al. |
| 5,869,927 A | 2/1999 | Matsuo et al. |
| 5,959,316 A | 9/1999 | Lowery |
| 5,962,971 A | 10/1999 | Chen |
| 5,998,925 A | 12/1999 | Shimizu et al. |
| 6,010,644 A | 1/2000 | Fu et al. |
| 6,013,199 A | 1/2000 | McFarland et al. |
| 6,066,861 A | 5/2000 | Höhn et al. |
| 6,069,440 A | 5/2000 | Shimizu et al. |
| 6,084,250 A | 7/2000 | Jüstel et al. |
| 6,096,243 A | 8/2000 | Oshio et al. |
| 6,116,754 A | 9/2000 | Ocsovai et al. |
| 6,117,362 A | 9/2000 | Yen et al. |
| 6,137,217 A | 10/2000 | Pappalardo et al. |
| 6,153,971 A | 11/2000 | Shimizu et al. |
| 6,165,385 A | 12/2000 | Rao et al. |
| 6,203,726 B1 | 3/2001 | Danielson et al. |
| 6,210,605 B1 | 4/2001 | Srivastava et al. |
| 6,222,312 B1 | 4/2001 | Ghosh et al. |
| 6,246,744 B1 | 6/2001 | Duclos et al. |
| 6,249,328 B1 | 6/2001 | Fukuzawa et al. |
| 6,249,583 B1 | 6/2001 | Levinson et al. |
| 6,252,254 B1 | 6/2001 | Soules et al. |
| 6,255,670 B1 | 7/2001 | Srivastava et al. |
| 6,278,135 B1 | 8/2001 | Srivastava et al. |
| 6,294,800 B1 | 9/2001 | Duggal et al. |
| 6,302,959 B1 | 10/2001 | Srivastava et al. |
| 6,319,425 B1 | 11/2001 | Tasaki et al. |
| 6,351,069 B1 | 2/2002 | Lowery et al. |
| 6,366,033 B1 | 4/2002 | Greci et al. |
| 6,369,502 B1 | 4/2002 | Auber et al. |
| 6,380,669 B1 | 4/2002 | Zachau et al. |
| 6,400,097 B1 | 6/2002 | Jin et al. |
| 6,402,987 B1 | 6/2002 | Srivastava et al. |
| 6,409,938 B1 | 6/2002 | Comanzo |
| 6,466,135 B1 | 10/2002 | Srivastava et al. |
| 6,472,812 B1 | 10/2002 | Vose et al. |
| 6,504,179 B1 | 1/2003 | Ellens et al. |
| 6,513,949 B1 | 2/2003 | Marshall et al. |
| 6,515,314 B1 | 2/2003 | Duggal et al. |
| 6,517,741 B1 | 2/2003 | Feldmann et al. |
| 6,521,915 B1 | 2/2003 | Odaki et al. |
| 6,522,065 B1 | 2/2003 | Srivastava et al. |
| 6,538,371 B1 | 3/2003 | Duggal et al. |
| 6,552,487 B1 | 4/2003 | Ellens et al. |
| 6,555,958 B1 | 4/2003 | Srivastava et al. |
| 6,576,931 B1 | 6/2003 | Furukawa et al. |
| 6,580,097 B1 | 6/2003 | Soules et al. |
| 6,592,780 B1 | 7/2003 | Höhn et al. |
| 6,596,195 B1 | 7/2003 | Srivastava et al. |
| 6,621,211 B1 | 9/2003 | Srivastava et al. |
| 6,660,186 B1 | 12/2003 | Ravilisetty |
| 6,669,866 B1 | 12/2003 | Kummer et al. |
| 6,676,853 B1 * | 1/2004 | Ueda et al. ............ 252/301.4 R |
| 2002/0105266 A1 | 8/2002 | Mayr |
| 2002/0158565 A1 | 10/2002 | Setlur et al. |
| 2002/0195587 A1 | 12/2002 | Srivastava et al. |
| 2003/0006694 A1 | 1/2003 | Carter |
| 2003/0030060 A1 | 2/2003 | Okazaki |

OTHER PUBLICATIONS

J.S. Kim et al.: "gaN–based white–light–emitting diodes fabricated with a mixture of Ba3Mgsi208:eu and Sr2Si04: Eu phophors", *Japanese Journal of Applied Physics*, vol. 43, No. 3, 2004, pp. 989–992.

Narukawa, Yukia, "Present Status of UV–LDs and White LEDs", Patented Abstracts of the International Synoposium on THE LIGHT FOR THE $2^{nd}$ CENTURY, Mar. 2002, Tokyo, K–4, pp. 14–15.

Inorganic Phosphors: Compositions, Preparation and Optical Properties, CRC Press, 2004.

* cited by examiner

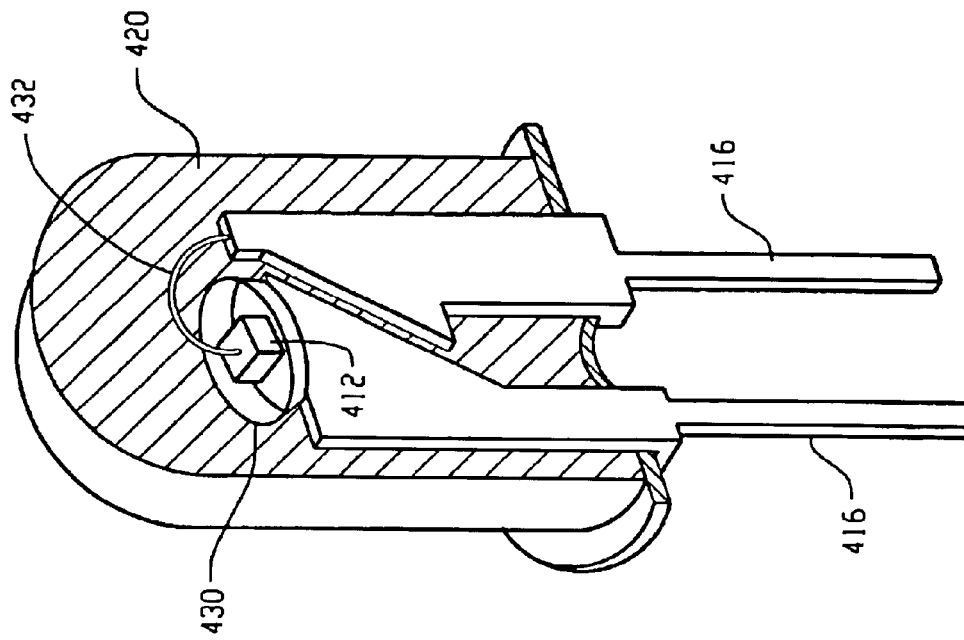
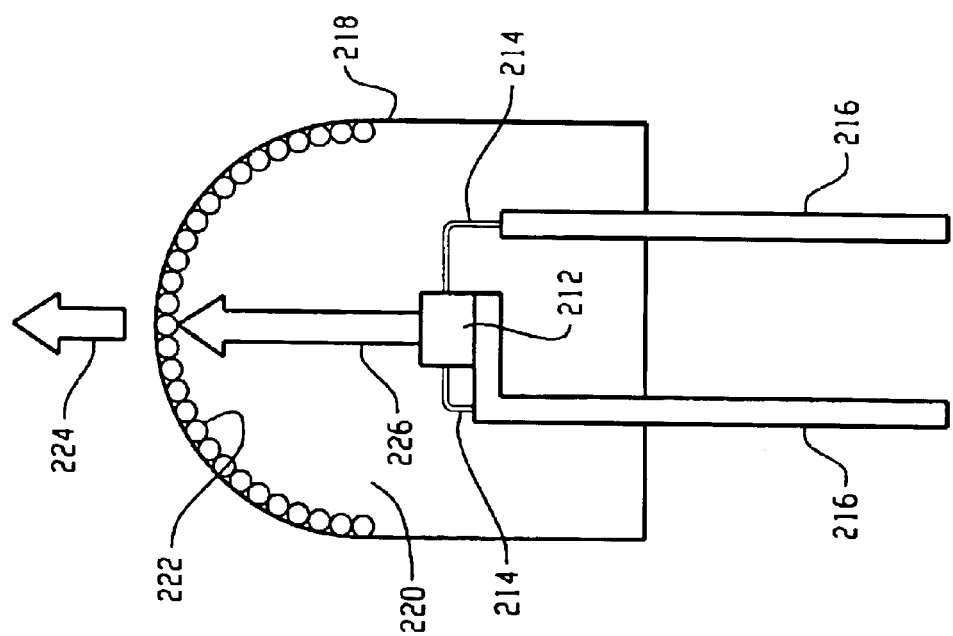

GREEN PHOSPHOR FOR GENERAL ILLUMINATION APPLICATIONS

BACKGROUND OF THE INVENTION

The present invention relates to phosphor compositions, particularly phosphors for use in lighting applications. More particularly, the present invention relates to a phosphor for converting UV light to green light for use in an LED or LCD and a lighting apparatus employing the same.

Light emitting diodes (LEDs) are semiconductor light emitters often used as a replacement for other light sources, such as incandescent lamps. They are particularly useful as display lights, warning lights and indicating lights or in other applications where colored light is desired. The color of light produce by an LED is dependent on the type of semiconducting material used in its manufacture.

Colored semiconductor light emitting devices, including light emitting diodes and lasers (both are generally referred to herein as LEDs), have been produced from Group III–V alloys such as gallium nitride (GaN). To form the LEDs, layers of the alloys are typically deposited epitaxially on a substrate, such as silicon carbide or sapphire, and may be doped with a variety of n and p type dopants to improve properties, such as light emission efficiency. With reference to the GaN-based LEDs, light is generally emitted in the UV and/or blue range of the electromagnetic spectrum. Until quite recently, LEDs have not been suitable for lighting uses where a bright white light is needed, due to the inherent color of the light produced by the LED.

LEDs rely on its semiconductor to emit light. The light is emitted as a result of electronic excitation of the semiconductor material. As radiation (energy) strikes atoms of the semiconductor material, an electron of an atom is excited and jumps to an excited (higher) energy state. The higher and lower energy states in semiconductor light emitters are characterized as the conduction band and the valence band, respectively. The electron, as it returns to its ground energy state, emits a photon. The photon corresponds to an energy difference between the exited state and ground energy state, and results in an emission of radiation.

Recently, techniques have been developed for converting the light emitted from LEDs to useful light for illumination purposes. In one technique, the LED is coated or covered with a phosphor layer. By interposing a phosphor excited by the radiation generated by the LED, light of a different wavelength, e.g., in the visible range of the spectrum may be generated. Colored LEDs are often used in toys, indicator lights and other devices. These LEDs typically contain a UV emitting LED and a red, blue, green or other color emitting phosphor. Manufacturer's are continuously looking for new colored phosphors for use in such LEDs to produce custom colors and higher luminosity.

In addition to colored LEDs, a combination of LED generated light and phosphor generated light may be used to produce white light. The most popular white LEDs consist of blue emitting GaInN chips. The blue emitting chips are coated with a phosphor that converts some of the blue radiation to a complimentary color, e.g. a yellow-green emission. Together, the blue and yellow-green radiation produces a white light. There are also white LEDs that utilize a UV emitting chip and a phosphor blend including red, green and blue emitting phosphors designed to convert the UV radiation to visible light.

One known yellow-whitish light emitting device comprises a blue light-emitting LED having a peak emission wavelength at about 450 nm combined with a yellow light-emitting phosphor, such as cerium doped yttrium aluminum garnet $Y_3Al_5O_2:Ce^{3+}$ ("YAG:Ce"). The phosphor absorbs a portion of the radiation emitted from the LED and converts the absorbed radiation to a yellow light. The remainder of the blue light emitted by the LED is transmitted through the phosphor and is mixed with the yellow light emitted by the phosphor. A viewer perceives the mixture of blue and yellow light, which in most instances is perceived as a whitish-yellow light. Such a device, while suitable for limited applications, fails in applications where a true bright white light of high intensity and brightness is desired.

In addition to this somewhat limited emission intensity, the color output of such an LED-phosphor system varies greatly due to frequent, unavoidable routine deviations from desired parameters (i.e. manufacturing systemic errors) during the production of the light. For example, the color output of the finished device is very sensitive to the thickness of the phosphor layer covering the LED. If the phosphor is too thin, then more than a desired amount of the blue light emitted by the LED will penetrate through the phosphor and the combined phosphor-LED output will appear bluish. In contrast, if the phosphor layer is too thick, then less than a desired amount of the blue LED light will penetrate through the phosphor layer. In this case, the combined phosphor-LED output will appear yellowish. Therefore, the thickness of the phosphor layer is an important variable affecting the color output of a blue LED based system. Unfortunately, the thickness of the phosphor layer is difficult to control during large-scale production of LED-phosphor lamp systems, and the variations in phosphor thickness often result in relatively poor lamp to lamp color control. In addition, lamp to lamp variations occur due to the varying of the optical power from chip to chip.

The use of a UV LED chip to manufacture such a white-light system should give superior color performance compared to those based on blue LED chips since the UV chip is not appreciably contributing to the visible color of the LED. Recent advances, such as those disclosed in U.S. Pat. No. 6,255,670, are directed to the use of specific phosphor systems in conjunction with a UV emitting LED to emit white light. While effective, new phosphor combinations are needed to produce efficient white light with various spectral outputs to meet the needs of different market segments.

Thus, a need exists for a new green emitting phosphor to produce both colored and white-light LEDs and showing improved lamp to lamp color control and acceptable luminous efficacy.

SUMMARY OF THE INVENTION

In one aspect, the present invention provides a composition having the general formula $Na_2(Ln_{1-y-z}Ce_yTb_z)_2B_2O_7$, wherein Ln is selected from the group consisting of La, Y, Gd, Lu, Sc and combinations thereof and wherein y=0.01–0.3 and z=0.0–0.3.

In a second aspect, the invention provides a white-light emitting device including a UV, blue or green semiconductor light source having a peak emission from about 250 to about 550 nm and a phosphor blend including a blue emitting phosphor, a red emitting phosphor and a green emitting phosphor comprising $Na_2(Ln_{1-y-z}Ce_yTb_z)_2B_2O_7$, wherein Ln is selected from the group consisting of La, Y, Gd, Lu, Sc and combinations thereof and wherein y=0.01–0.3 and z=0.0–0.3.

In a third aspect, the present invention provides a phosphor blend comprising a blue emitting phosphor, a red emitting phosphor and a green emitting phosphor comprising $Na_2(Ln_{1-y-z}Ce_yTb_z)_2B_2O_7$, wherein Ln is selected from the group consisting of La, Y, Gd, Lu, Sc and combinations thereof and wherein y=0.01–0.3 and z=0.0–0.3, and further wherein said phosphor blend is capable of producing white light when excited with UV radiation.

In a fourth aspect, a method for forming a lighting apparatus is provided, the method including the steps of providing a semiconductor UV, blue or green light source capable of emitting radiation having a peak emission from about 250 to about 550 nm, and radiationally coupling a phosphor blend to the semiconductor light source, the phosphor blend a phosphor blend comprising a blue emitting phosphor, a red emitting phosphor and a green emitting phosphor comprising $Na_2(Ln_{1-y-z}Ce_yTb_z)_2B_2O_7$, wherein Ln is selected from the group consisting of La, Y, Gd, Lu, Sc and combinations thereof and wherein y=0.01–0.3 and z=0.0–0.3; wherein the phosphor blend is capable of absorbing the radiation emitted by the semiconductor light source and converting the radiation into white light.

BRIEF DESCRIPTION OF THE DRAWINGS

FIG. 3 is a schematic cross-sectional view of a white light illumination system in accordance with a third embodiment of the present invention.

FIG. 4 is a cutaway side perspective view of an illumination system in accordance with a fourth embodiment of the present invention.

DETAILED DESCRIPTION OF THE INVENTION

Phosphors convert radiation (energy) to visible light. Different combinations of phosphors provide different colored light emissions. The colored light that originates from the phosphors provides a color temperature.

A phosphor conversion material (phosphor material) absorbs light generated from an LED (such as UV light) and converts it to white or colored light. The color of the generated visible light is dependent on the particular components of the phosphor material. The phosphor material may include only a single phosphor composition or two or more phosphors of basic color, for example a particular mix with one or more of a yellow and blue phosphor to emit a desired color (tint) of light. As used herein, phosphor material is intended to include both a single phosphor as well as a blend of two or more phosphors.

It was determined that an LED lamp that produces a bright-white light would be useful to impart desirable qualities to LEDs as light sources. Therefore, in one embodiment of the invention, a luminescent material phosphor conversion material blend (phosphor blend) coated LED is disclosed for providing white light. The individual phosphors and a phosphor blend including the individual phosphors convert radiation at a specified wavelength, for example radiation from about 250 to about 550 nm as emitted by a LED, into visible light. The visible light provided by the phosphor blend comprises a bright white light with high intensity and brightness.

Figure 1:
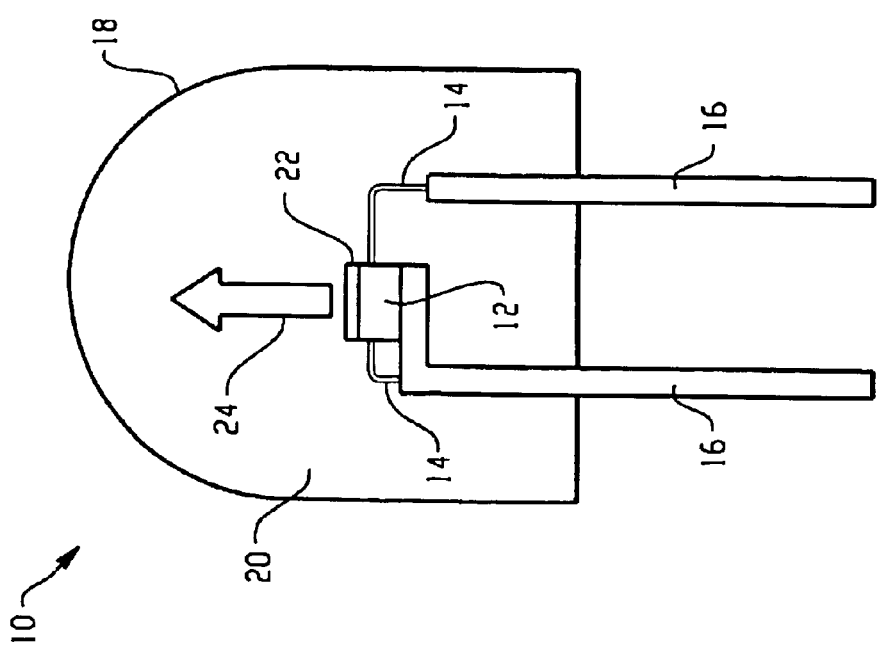
FIG. 1 is a schematic cross-sectional view of a white light illumination system in accordance with one embodiment of the present invention.

With reference to FIG. 1, an exemplary light emitting assembly or lamp 10 is shown in accordance with one embodiment of the present invention. The light emitting assembly 10 comprises a semiconductor UV, blue or green radiation source, such as a light emitting diode (LED) chip 12 and leads 14 electrically attached to the LED chip. The leads 14 may comprise thin wires supported by a thicker lead frame(s) 16 or the leads may comprise self supported electrodes and the lead frame may be omitted. The leads 14 provide current to the LED chip 12 and thus cause the LED chip 12 to emit radiation.

The lamp may include any semiconductor UV, blue or green light source that is capable of producing white light when its emitted radiation is directed onto the phosphor and generally having an emission wavelength from 250 to 550 nm. In a preferred embodiment, the semiconductor light source comprises a UV/blue emitting LED doped with various impurities. Thus, the LED may comprise a semiconductor diode based on any suitable III–V, II–VI or IV—IV semiconductor layers and having an emission wavelength of about 370 to 500 nm. Preferably, the LED may contain at least one semiconductor layer comprising GaN, ZnSe or SiC. For example, the LED may comprise a nitride compound semiconductor represented by the formula $In_iGa_jAl_kN$ (where $0 \leq i$; $0 \leq j$; $0 \leq k$ and i+J+k=1) having an emission wavelength greater than about 370 nm and less than about 450 nm. Preferably, the UV chip has a peak emission wavelength from about 400 to about 410 nm. Such LED semiconductors are known in the art. The radiation source is described herein as an LED for convenience. However, as used herein, the term is meant to encompass all semiconductor radiation sources including semiconductor laser diodes.

The LED chip 12 may be encapsulated within a shell 18, which encloses the LED chip and an encapsulant material 20. The shell 18 may be, for example, glass or plastic. Preferably, the LED 12 is substantially centered in the encapsulant 20. The encapsulant 20 is preferably an epoxy, plastic, low temperature glass, polymer, thermoplastic, thermoset material, resin or other type of LED encapsulating material as is known in the art. Optionally, the encapsulant 20 is a spin-on glass or some other high index of refraction material. Preferably, the encapsulant material 20 is an epoxy or a polymer material, such as silicone. Both the shell 18 and the encapsulant 20 are preferably transparent or substantially optically transmissive with respect to the wavelength of light produced by the LED chip 12 and a phosphor composition 22 (described below). Alternately, the lamp may 10 may only comprise an encapsulant material without an outer shell 18. The LED chip 12 may be supported, for example, by the lead frame 16, by the self supporting electrodes, the bottom of the shell 18, or by a pedestal (not shown) mounted to the shell or to the lead frame.

The structure of the illumination system includes a phosphor composition 22 radiationally coupled to the LED chip 12. Radiationally coupled means that the elements are associated with each other so radiation from one is transmitted to the other. In a preferred embodiment, the phosphor composition 22 is a blend of two or more phosphors, as will be detailed below. This phosphor composition 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of the phosphor composition 22 and LED 12. Thus, the phosphor composition 22 may be coated over or directly on the light emitting surface of the LED chip 12 by coating and drying the phosphor suspension over the LED chip 12. Both the shell 18 and the encapsulant 20 should be transparent to allow white light 24 to be transmitted through those elements. Although not intended to be limiting, in one embodiment, the median particle size of the phosphor composition may be from about 1 to about 10 microns.

Figure 2:
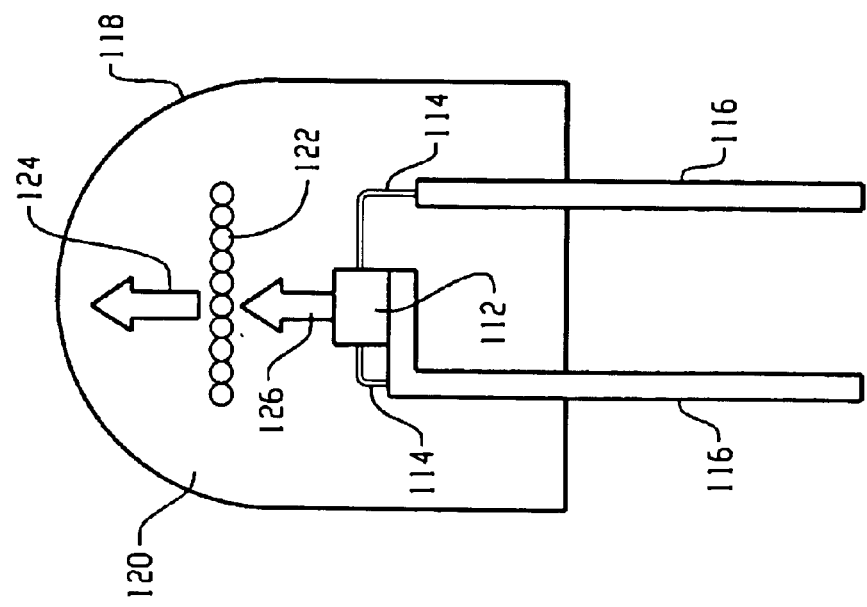
FIG. 2 is a schematic cross-sectional view of a white light illumination system in accordance with a second embodiment of the present invention.

FIG. 2 illustrates a second preferred structure of the system according to the preferred aspect of the present invention. The structure of the embodiment of FIG. 2 is similar to that of FIG. 1, except that the phosphor composition 122 is interspersed within the encapsulant material 120, instead of being formed directly on the LED chip 112. The phosphor (in the form of a powder) may be interspersed within a single region of the encapsulant material 120 or, more preferably, throughout the entire volume of the encapsulant material. UV light 126 emitted by the LED chip 112 mixes with the light emitted by the phosphor composition 122, and the mixed light appears as white light 124. If the phosphor is to be interspersed within the encapsulant material 120, then a phosphor powder may be added to a polymer precursor, loaded around the LED chip 112, and then the polymer precursor may be cured to solidify the polymer material. Other known phosphor interspersion methods may also be used, such as transfer loading.

FIG. 3 illustrates a third preferred structure of the system according to the preferred aspects of the present invention. The structure of the embodiment shown in FIG. 3 is similar to that of FIG. 1, except that the phosphor composition 222 is coated onto a surface of the shell 218, instead of being formed over the LED chip 212. The phosphor composition is preferably coated on the inside surface of the shell 218, although the phosphor may be coated on the outside surface of the shell, if desired. The phosphor composition 222 may be coated on the entire surface of the shell or only a top portion of the surface of the shell. The UV light 226 emitted by the LED chip 212 mixes with the light emitted by the phosphor composition 222, and the mixed light appears as white light 224. Of course, the embodiments of FIGS. 1–3 may be combined and the phosphor may be located in any two or all three locations or in any other suitable location, such as separately from the shell or integrated into the LED.

In any of the above embodiments, the lamp 10 may also include a plurality of scattering particles (not shown), which are embedded in the encapsulant material. The scattering particles may comprise, for example, $Al_2O_3$ particles such as alumina powder or $TiO_2$ particles. The scattering particles effectively scatter the coherent light emitted from the LED chip, preferably with a negligible amount of absorption. The coupling of the diffuse scattered LED light with the phosphor is advantageous in reducing optical saturation effects and physical damage of the phosphor material.

As shown in a fourth embodiment in FIG. 4, the LED chip 412 may be mounted in a reflective cup 430. The cup 430 may be made from or coated with a reflective material, such as alumina, titania, or other dielectric powder known in the art. A preferred reflective material is $Al_2O_3$. The remainder of the structure of the embodiment of FIG. 4 is the same as that of any of the previous Figures, and includes two leads 416, a conducting wire 432 electrically connecting the LED chip 412 with the second lead, and an encapsulant material 420.

In one embodiment, the phosphor composition 22 used in the invention is a composition having the general formula $Na_2Ln_2B_2O_7$ wherein Ln is La, Y, Gd, Lu, Sc or a combination of one or more of these. The above phosphor is activated by $Tb^{3+}$, $Ce^{3+}$ or a combination of the two, producing a green emitting phosphor when excited by UV light. More specifically, the phosphor may have the formula $Na_2(Ln_{1-y-z}Ce_yTb_z)_2B_2O_7$, wherein Ln is selected from the group consisting of La, Y, Gd, Lu, Sc and combinations thereof and wherein y=0.01–0.3 and z=0.0–0.3. In such an embodiment, the resulting lighting system will produce a light having a green color, the characteristics of which will be discussed in more detail below.

In another embodiment, the phosphor composition 22 is a blend of two or more phosphors. When used in a lighting assembly in combination with a UV LED emitting radiation in the range of about 370 to 500 nm, the resultant light emitted by the assembly will be a white light. In one embodiment, the phosphor composition comprises a blend of a blue emitting phosphor, a red emitting phosphor, and a green phosphor having the general formula described above.

The $Na_2(Ln_{1-y-z}Ce_yTb_z)_2B_2O_7$ phosphor for use in the phosphor composition may be produced by a method comprising the steps of: (1) providing stoichiometric amounts of oxygen-containing compounds of terbium; oxygen-containing compounds of at least one rare-earth metal selected from the group consisting of Ce, La, Y, Gd, Lu, and Sc along with oxygen-containing compounds of B and Na; (2) mixing together the oxygen-containing compounds to form a mixture; and (3) firing the mixture in air or a reducing atmosphere at a temperature and for a time sufficient to convert the mixture to a cerium and terbium-activated phosphor having the above formula.

The oxygen-containing compounds may be mixed together by any mechanical method including, but not limited to, stirring or blending in a high-speed blender or a ribbon blender. The oxygen-containing compounds may be combined and pulverized together in a bowl mill, a hammer mill, or a jet mill. The mixing may be carried out by wet milling especially when the mixture of the oxygen-containing compounds is to be made into a solution for subsequent precipitation. If the mixture is wet, it may be dried first before being fired under a reducing atmosphere at a temperature from about 700° C. to about 1700° C., preferably from about 800° C. to about 1100° C. for a time sufficient to convert all of the mixture to the final composition. The firing may be conducted in a batchwise or continuous process, preferably with a stirring or mixing action to promote good gas-solid contact. The firing time depends on the quantity of the mixture to be fired, the rate of gas conducted through the firing equipment, and the quality of the gas-solid contact in the firing equipment. Typically, a firing time up to about 10 hours is adequate. The reducing atmosphere typically comprises a reducing gas such as hydrogen, carbon monoxide, or a combination thereof, optionally diluted with an inert gas, such as nitrogen, helium, neon, argon, krypton, xenon, or a combination thereof. Alternatively, the crucible containing the mixture may be packed in a second closed crucible containing high-purity carbon particles and fired in air so that the carbon particles react with the oxygen present in air, thereby, generating carbon monoxide that is needed to provide the reducing atmosphere.

Figure 5:
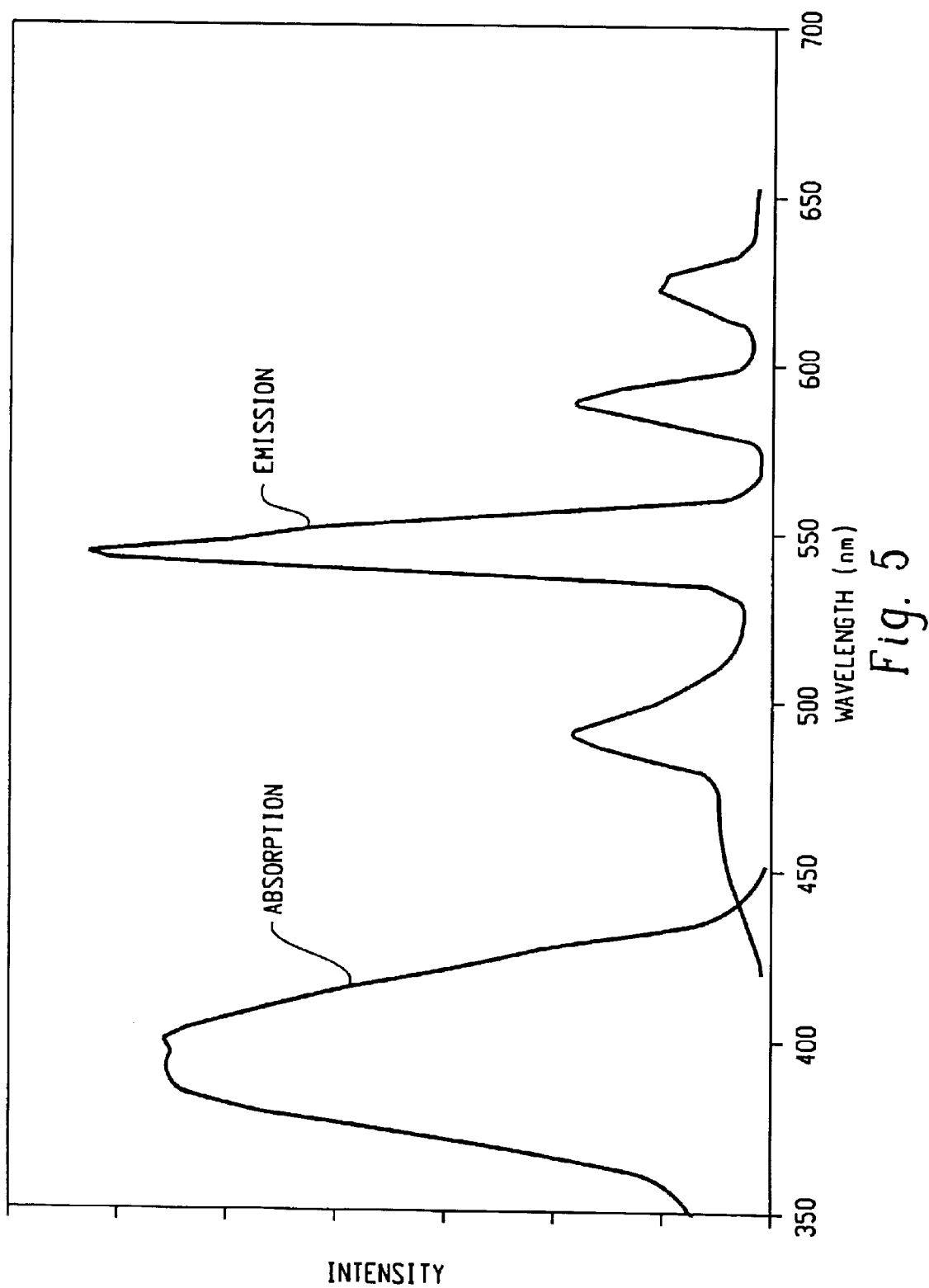
FIG. 5 is a graph of the absorption and emission spectra of $Na_2(Gd_{0.85}Ce_{0.05}Tb_{0.10})_2B_2O_7$.

In one preferred embodiment, the $Na_2(Ln_{1-y-z}Ce_yTb_z)_2B_2O_7$ phosphor has the formula $Na_2(Gd_{0.85}Ce_{0.05}Tb_{0.10})_2B_2O_7$. FIG. 5 is a graph of the absorption and emission of $Na_2(Gd_{0.85}Ce_{0.05}Tb_{0.10})_2B_2O_7$. The emission spectrum used 405 nm light to excite the phosphor. The UV LED radiation is absorbed by the $Ce^{3+}$ ion and transferred to the $Tb^{3+}$ ion. In addition to being quite efficient, this energy transfer produces a sharp green line emission centered at about 545 nm. This emission wavelength centered at 545 nm is near the peak in the CIE tristimulus function that is used to describe the color green. This emission is quite preferred for generating green photons for use in green colored LEDs as well as the green component in a white light phosphor blend.

In a second embodiment, the phosphor composition includes a blend of the $Na_2(Ln_{1-y-z}Ce_yTb_z)_2B_2O_7$ phosphor described above and a red and blue emitting phosphor to create a white light emitting phosphor blend. Any known red and blue phosphor suitable for use in UV LED systems may be used. As a substitute for or in addition to the red phosphor, a yellow-orange or deep red phosphor may be used in the blend to customize the white color of the resulting light. Other blue-green, green, orange or additional phosphor may also be included based on the needs of the manufacturer. While not intended to be limiting, suitable phosphor for use in the blend with the $Na_2(Ln_{1-y-z}Ce_yTb_z)_2B_2O_7$ phosphor include:

BLUE:
  $(Ba,Sr,Ca,Mg)_5(PO_4)_3(Cl,F,Br,OH):Eu^{2+},Mn^{2+},Sb^{3+}$
  $(Ba,Sr,Ca)MgAl_{10}O_{17}:Eu^{2+},Mn^{2+}$
  $(Ba,Sr,Ca)BPO_5:Eu^{2+}$
  $(Sr,Ca)_{10}(PO_4)_6*nB_2O_3:Eu^{2+}$
  $2SrO*0.84P_2O_5*0.16B_2O_3:Eu^{2+}$
  $Sr_2Si_3O_8*2SrCl_2:Eu^{2+}$
  $Ba_3MgSi_2O_8:Eu^{2+}$
  $Sr_4Al_{14}O_{25}:Eu^{2+}$
  $BaAl_8O_{13}:Eu^{2+}$

BLUE-GREEN:
  $Sr_4Al_{14}O_{25}:Eu^{2+}$
  $BaAl_8O_{13}:Eu^{2+}$
  $2SrO-0.84P_2O_{5-0.16}B_2O_3:Eu^{2+}$
  $(Ba,Sr,Ca)MgAl_{10}O_{17}:Eu^{2+},Mn^{2+}$
  $(Ba,Sr,Ca)_5(PO_4)_3(Cl,F,OH):Eu^{2+},Mn^{2+},Sb^{3+}$

GREEN:
  $(Ba,Sr,Ca)MgAl_{10}O_17:Eu^{2+},Mn^{2+}$ (BAMn)
  $(Ba,Sr,Ca)Al_2O_4:Eu^{2+}$
  $(Y,Gd,Lu,Sc,La)BO_3:Ce^{3+},Tb^{3+}$
  $Ca_8Mg(SiO_4)_4Cl_2:Eu^{2+},Mn^{2+}$
  $(Ba,Sr,Ca)_2SiO_4:Eu^{2+}$
  $(Ba,Sr,Ca)_2(Mg,Zn)Si_2O_7:Eu^{2+}$
  $(Sr,Ca,Ba)(Al,Ga,In)_2S_4:Eu^{2+}$
  $(Y,Gd,Tb,La,Sm,Pr,Lu)_3(Al,Ga)_5O_{12}:Ce^{3+}$
  $(Ca,Sr)_8(Mg,Zn)(SiO_4)_4Cl_2:Eu^{2+},Mn^{2+}$ (CASI)
  $Na_2Gd_2B_2O_7:Ce^{3+},Tb^{3+}$
  $(Ba,Sr)2(Ca,Mg,Zn)B2O6:K,Ce,Tb$

YELLOW-ORANGE:
  $(Sr,Ca,Ba,Mg,Zn)_2P_2O_7:Eu^{2+},Mn^{2+}$ (SPP);
  $(Ca,Sr,Ba,Mg)_{10}(PO_4)_6(F,Cl,Br,OH):Eu^{2+},Mn^{2+}$ (HALO);

RED:
  $(Gd,Y,Lu,La)_2O_3:Eu^{3+},Bi^{3+}$
  $(Gd,Y,Lu,La)_2O_2S:Eu^{3+},Bi^{3+}$
  $(Gd,Y,Lu,La)VO_4:Eu^{3+,Bi3+}$
  $(Ca,Sr)S:Eu^{2+}$
  $SrY_2S_4:Eu^{2+}$
  $CaLa_2S_4:Ce^{3+}$
  $(Ca,Sr)S:Eu^{2+}$
  $3.5MgO*0.5MgF_2*GeO_2:Mn^{4+}$ (MFG)
  $(Ba,Sr,Ca)MgP_2O_7:Eu_{2+},Mn_{2+}$
  $(Y,Lu)_2WO_6:Eu^3+,Mo^{6+}$
  $(Sr,Ca,Ba)_3MgSi_2O_8:Eu^{2+},Mn^{2+}$
  $(Ba,Sr,Ca)_2SiO_4:Eu^{2+}$

Figure 6:
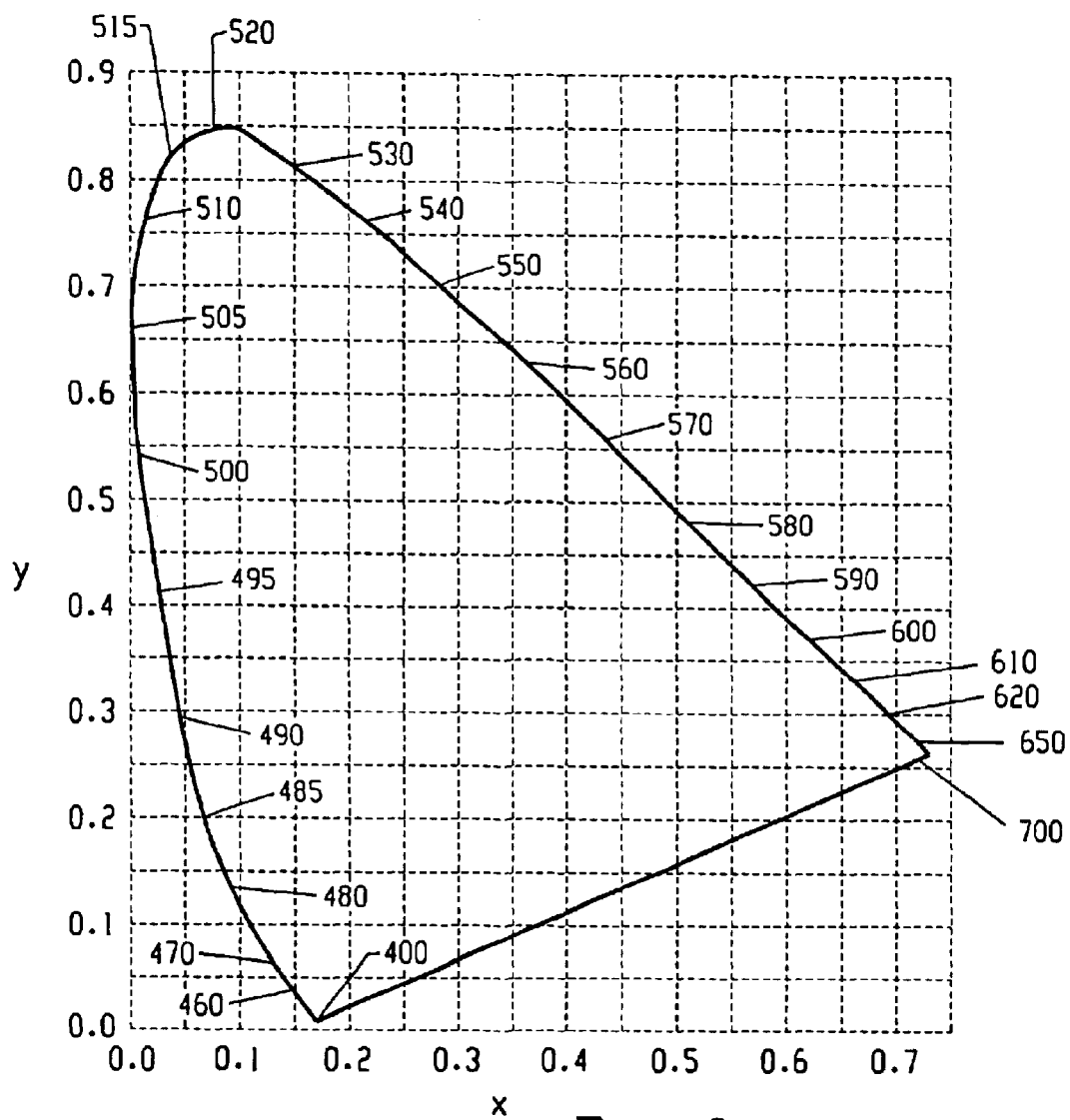
FIG. 6 is plot of the CIE chromaticity diagram.

The weight ratio of each of the individual phosphors in the phosphor blend may vary depending on the characteristics of the desired light output. The relative proportions of the individual phosphors in the various embodiment phosphor blends may be adjusted such that when their emissions are blended and employed in an LED lighting device, there is produced visible light of predetermined x and y values on the CIE chromaticity diagram, which is depicted in FIG. 6. As stated, a white light is preferably produced. This white light may, for instance, possess an x value in the range of about 0.30 to about 0.45, and a y value in the range of about 0.30 to about 0.45.

The relative amounts of each phosphor in the phosphor composition can be described in terms of spectral weight. The spectral weight is the relative amount that each phosphor contributes to the overall emission spectra of the phosphor blend when excited by UV light. The spectral weight amounts of all the individual phosphors should add up to 1. Although not intended to be limiting, the phosphor composition of the present invention may generally contain, in spectral weight amounts, about 0.0–0.4 of a blue phosphor, about 0.05–0.6 of the above $Na_2(Ln_{1-y-z}Ce_yTb_z)_2B_2O_7$ green phosphor, about 0.05–0.55 of a red phosphor, and about 0.0–0.75 of a yellow-orange phosphor. Such a blend would produce a white light suitable for general illumination. As stated, however, the exact identity and amounts of each phosphor in the phosphor composition can be varied according to the needs of the end user.

The phosphor composition described above may be used in additional applications besides LEDs. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are meant to be merely exemplary and not exhaustive.

Figure 7:
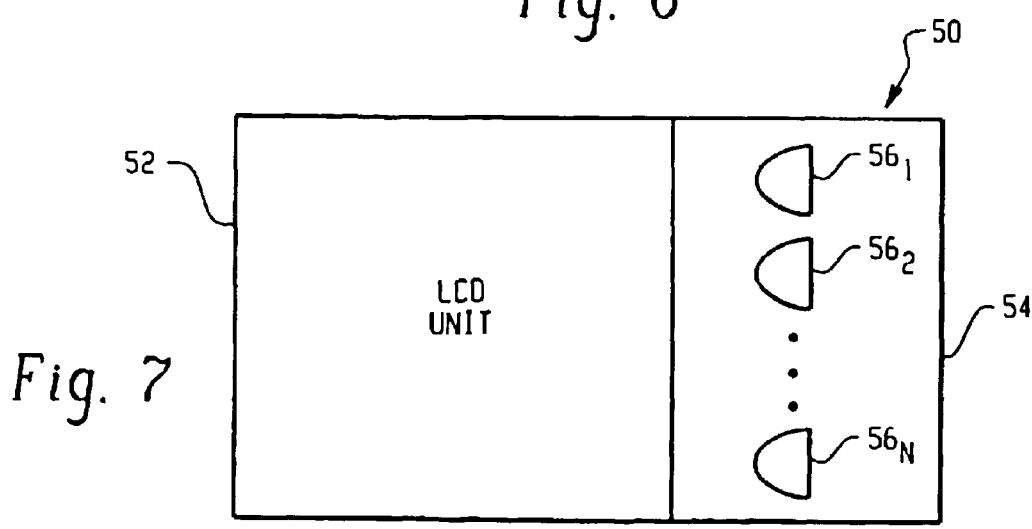
FIG. 7 is a view of an LCD unit and an LED-based backlighting system therefore.

For example, in another embodiment, the $Na_2(Ln_{1-y-z}Ce_yTb_z)_2B_2O_7$ phosphor can be used to generate green photons in an LCD backlight phosphor blend. FIG. 7 shows a system 50 for back-lighting a LCD unit via a mixture of saturated LEDs. FIG. 7 shows a side elevational view of an LCD unit 52 including a back-lighting unit 54 having a number, N, of saturated LEDs $56_1$–$56_N$ suitably mounted to emit radiation toward a back panel of LCD unit 52. In system 50, the LEDs LEDs $56_1$–$56_N$ may, for example, be chosen to be two groups of LEDs each emitting different saturated colors. The $Na_2(Ln_{1-y-z}Ce_yTb_z)_2B_2O_7$ phosphor may be used to emit the green color for the backlight. The two colors are typically chosen so that they lie on a line on the CIE chromaticity diagram that contains therebetween the coordinates of the target color.

The invention has been described with reference to various preferred embodiments. Modifications and alteration will occur to others upon a reading and understanding of this specification. The invention is intended to include all such modifications and alterations insofar as they come within the scope of the appended claims or the equivalent thereof.

What is claimed is:

1. A lighting apparatus for emitting white light comprising:
   a semiconductor light source emitting radiation having a wavelength in the range of from about 250 to about 550 nm;
   a phosphor composition radiationally coupled to the semiconductor light source, the phosphor composition comprising a blue emitting phosphor, a red emitting phosphor and a green emitting phosphor comprising $Na_2(Ln_{1-y-z}Ce_yTb_z)_2B_2O_7$, wherein Ln is selected from the group consisting of La, Y, Gd, Lu, Sc and combinations thereof and wherein y=0.01–0.3 and z=0.01–0.3.

2. The lighting apparatus of claim 1, wherein the semiconductor light source is a light emitting diode (LED).

3. The lighting apparatus of claim 2, wherein the LED comprises a nitride compound semiconductor represented by the formula $In_iGa_jAl_kN$, where $0 \leq i$; $0 \leq j$, $0 \leq K$, and i+j+k=1.

4. The lighting apparatus of claim 1, wherein the phosphor composition is coated on the surface of the semiconductor light source.

5. The lighting apparatus of claim 1, further comprising an encapsulant surrounding the semiconductor light source and the phosphor composition.

6. The lighting apparatus of claim 1, wherein the phosphor composition is dispersed in the encapsulant.

7. The lighting apparatus of claim 1, further comprising a reflector cup.

8. The lighting apparatus of claim 1, wherein the green emitting phosphor comprises $Na_2(Gd_{0.85}Ce_{0.05}Tb_{0.10})_2B_2O_7$.

9. The lighting apparatus of claim 1, wherein said phosphor composition further comprises at least one of a blue-green emitting phosphor, an yellow-orange emitting phosphor, an orange emitting phosphor and a deep red emitting phosphor.

10. The lighting apparatus of claim 9, wherein said phosphor composition comprises a spectral weight of 0.0–0.4 of the blue phosphor, about 0.05–0.6 of the $Na_2(Ln_{1-y-z}Ce_yTb_z)_2B_2O_7$ phosphor, about 0.05–0.55 of the red phosphor, and about 0.0–0.75 of the yellow-orange phosphor.

11. The lighting apparatus of claim 1, wherein the green emitting phosphor comprises $Na_2(Ln_{1-y-z}Ce_y)_2B_2O_7$, wherein Ln is selected from the group consisting of La, Y, Gd, Lu, Sc and combinations thereof and wherein y=0.01–0.3.

12. The lighting apparatus of claim 1, wherein said blue emitting phosphor is selected from the group consisting of $(Ba,Sr,Ca)_5(PO_4)_3(Cl,F,Br,OH):Eu^{2+}$, $Mn^{2+}$; $Sb^{3+}$, $(Ba,Sr,Ca)MgAl_{10}O_{17}:Eu^{2+}$; $(Ba,Sr,Ca)BPO_5:Eu^{2+}$; $(Sr,Ca)_{10}(PO_4)_6*nB_2O_3:Eu^{2+}$; $2SrO*0.84P_2O_5*0.16B_2O_3:Eu^{2+}$; $Sr_2Si_3O_8*2SrCl_2:Eu^{2+}$; $Ba_3MgSi_2O_8:Eu^{2+}$; $Sr_4Al_{14}O_{25}:Eu^{2+}$; and $BaAl_8O_{13}:Eu^{2+}$.

13. The lighting apparatus of claim 1, wherein said red phosphor is selected from the group consisting of $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)MgP_2O_7:Eu^{2+},Mn^{2+}$; $(Y,Lu)_2WO_6:Eu^{3+},Mo^{6+}$; $(Sr,Ca,Ba)_3MgSi_2O_8:Eu^{2+},Mn^{2+}$; and $(Ba,Sr,Ca)_2SiO_4:Eu^{2+}$.

14. The lighting apparatus of claim 1, wherein the semiconductor light source emits radiation having a wavelength of from 370–500 nm.

15. The lighting apparatus of claim 14, wherein the semiconductor light source emits radiation having a wavelength of from 400–410 nm.

16. A composition of matter having the formula $Na_2(Ln_{1-y-z}Ce_yTb_z)_2B_2O_7$, wherein Ln is selected from the group consisting of La, Y, Gd, Lu, Sc and combinations thereof and wherein y=0.01–0.3 and z=0.0–0.3.

17. The composition according to claim 16, wherein said composition is capable of emitting light having a peak emission at about 545 nm when excited with light having a wavelength of 405 nm.

18. The composition according to claim 16, wherein the composition has the formula $Na_2(Gd_{0.85}Ce_{0.05}Tb_{0.10})_2B_2O_7$.

19. The composition according to claim 16, wherein said composition is suitable for use as a phosphor for converting UV light to visible green light in an UV LED lighting system.

20. The composition according to claim 16, wherein said composition is suitable for use as a green emitting component of a phosphor blend for use in an LCD backlight.

21. A method for forming a lighting apparatus, the method comprising the steps of:
   providing an LED capable of emitting radiation having a wavelength of about 250–550 nm;
   radiationally coupling a phosphor composition to the LED, the phosphor composition comprising a blue emitting phosphor, a red emitting phosphor and a green emitting phosphor comprising $Na_2(Ln_{1-y-z}Ce_yTb_z)_2B_2O_7$, wherein Ln is selected from the group consisting of La, Y, Gd, Lu, Sc and combinations thereof and wherein y=0.01–0.3 and z=0.0–0.3;
   wherein the phosphor composition is capable of absorbing the radiation emitted by the semiconductor light source and converting the radiation into white light.

22. The method according to claim 21, wherein the step of providing an LED is performed by providing a UV/blue LED having an emission wavelength of from 370–500 nm.

23. A phosphor blend comprising a blue emitting phosphor, a red emitting phosphor and a green emitting phosphor comprising $Na_2(Ln_{1-y-z}Ce_yTb_z)_2B_2O_7$, wherein Ln is selected from the group consisting of La, Y, Gd, Lu, Sc and combinations thereof and wherein y=0.01–0.3 and z=0.0–0.3.

24. The phosphor blend of claim 23, wherein said phosphor blend is capable of absorbing the radiation emitted by a semiconductor light source emitting from 370–500 nm and converting the radiation into white light.

* * * * *